United States Patent [19]
Ho

[11] Patent Number: 5,828,580
[45] Date of Patent: Oct. 27, 1998

[54] CONNECTIVITY-BASED APPROACH FOR EXTRACTING PARASITIC LAYOUT IN AN INTEGRATED CIRCUIT

[75] Inventor: William Wai Yan Ho, San Jose, Calif.

[73] Assignee: EPIC Design Technology, Inc., Sunnyvale, Calif.

[21] Appl. No.: 335,592

[22] Filed: Nov. 8, 1994

[51] Int. Cl.$^6$ .................................................. G06F 15/00
[52] U.S. Cl. ...................... 364/489; 364/488; 364/490; 364/491
[58] Field of Search .................................. 364/488, 489, 364/490, 491, 578; 437/250; 377/57; 326/93, 16, 21, 37, 56, 63; 257/922; 327/284, 530, 544, 277, 281; 395/921, 500; 371/27

[56] References Cited

U.S. PATENT DOCUMENTS

| | | | |
|---|---|---|---|
| 5,031,111 | 7/1991 | Chao et al. | 364/491 |
| 5,202,841 | 4/1993 | Tani | 364/491 |
| 5,210,701 | 5/1993 | Hana et al. | 364/488 |
| 5,231,590 | 7/1993 | Kumar et al. | 364/491 |
| 5,247,456 | 9/1993 | Ohe et al. | 564/491 |
| 5,278,769 | 1/1994 | Bair et al. | 364/490 |
| 5,303,161 | 4/1994 | Burns et al. | 364/490 |
| 5,305,229 | 4/1994 | Dhar | 364/489 |
| 5,351,197 | 9/1994 | Upton et al. | 364/490 |
| 5,367,468 | 11/1994 | Fukasawa et al. | 364/490 |
| 5,381,345 | 1/1995 | Takegami et al. | 364/489 |
| 5,402,358 | 3/1995 | Smith et al. | 364/490 |
| 5,416,717 | 5/1995 | Miyama et al. | 364/488 |
| 5,440,720 | 8/1995 | Baisuck et al. | 364/489 |

OTHER PUBLICATIONS

Wang, Z. and Qiming Wu, IEEE Transactions on Computer–Aided Design, vol. 11, No. 4, *Apr. 1992*, "A Two–Dimensional Resistance Simulator Using the Boundary Element Method", pp. 497–504.

Fukuda, Sanae et al., IEEE Transactions on Computer–Aided Design, vol. 9, No. 1, *Jan. 1990*, "A ULSI 2–D Capacitance Simulator for Complex Structures Based on Actual Processes", pp. 39–47.

McCormick, Steven P., 21st Design Automation Conference, Paper 39.2, "EXCL: A Circuit Extractor for IC Designs", pp. 616–623 Jan. 1984.

Stark, Don and Mark Horowitz, 24th ACM/IEEE Design Automatic Conference, Paper 32.2, "REDS: Resistance Extraction for Digital Simulation", pp. 570–573 Jan. 1987.

Horowitz, Mark and Robert W. Dutton, IEEE Transactions on Computer–Aided Design, vol. CAD–2, No. 3, *Jul. 1983*, "Resistance Extraction from Mask Layout Data", pp. 145–150.

Hwang, Jerry P., 28th ACM/IEEE Design Automation Conference, Paper 41.1, "REX—A VLSI Parasitic Extraction Tool for Electromigration and Signal Analysis", pp. 717–722 Jan. 1991.

*Primary Examiner*—Jacques Louis-Jacques
*Attorney, Agent, or Firm*—Towsend and Towsend and Crew LLP

[57] ABSTRACT

A layout parasitic extraction system. The present invention is a connectivity-based approach for extracting layout parasitics. The present invention creates a connectivity-based database, where geometries of a layout are organized by net. The present invention allows net-by-net extraction of layout parasitics using a connectivity-based database. Furthermore, a user can select a net or nets for extraction. The present invention outputs a database containing nets and their extracted layout parasitics. The present invention can create a netlist format file from a database containing nets and their extracted parasitics to allow back annotation of layout parasitics into a circuit schematic or for use for other software (possibly from a third-party).

3 Claims, 21 Drawing Sheets

Microfiche Appendix Included
(1 Microfiche, 64 Pages)

```
*System;; System block
   DBUnit = 0.001 Um;; DDB length unit, unit is case in
           default is microns = Um RESOlution = 0.05 Um;; DDB digitization grid unit
              default is microns = Um CAP-Mode = 3; capacitor simulation model number
              3 = parallel-plate, empirical 2D model
              valid numbers range from 1 to 39
              1-19 = empirical model; 20-39 = field
              solver model CAP-Unit = ff; pf = picofarads, or ff = femtofarads
              case insensitive, default is ff RES-UNIT  = mohm; ohm or mohm = milliohm
              case insensitive, default is mohm PROBe-text = TEST1; probe text file name, case sensi-
              tive;probe text file name is case sensitive PROcess = process_name; process name stored in model
           header process_name is case sensitive SUMmary = sum_filename; extraction report summary ,
           filename; sum_filename is case sensitive CAP_ENVIRONMENT = PHYA CPLYB ALA ALB; case insensitive
         interconnect layers for capacitance simulation
         environment layers should be same for MODELING
         and RCEXTRACT steps EXTract-net-file = netfile2;
           selected nets input filename is case sensitive INPUT-DRACULA  =../LPEdata; DRACULA database directory OUTPUT-SPICE = Spice; SPICE output file name
   OUTPUT-GDS2  = output,.GDS2 out_TopCell; GDSII output
           filenames.
   OUTPUT-TIMEMILL = TimeMill; TimeMill output file name
   OUTPUT-POWERMILL = PowerMill; PowerMill output file
         name above output file names are case sensitive
```

*FIG. 6.*

*Library;; Library block

This section contains the file names to be used for storing the geometry model library information generated by the MODELING command.

save-R-model=New_R_Mod; New R geometry model library file
   save-C-model=New_C_Mod; New C geometry model library file
   R-model=Old_R_Mod; Old R geometry model library file
   C-model=Old_C_Mod; Old R geometry model library file
      above output file names are case sensitive

*FIG. 7.*

*Display;; Display block

All layer names in this section must agree exactly with the internal Dracula database (DDB) layer names.

All layer numbers in this section must agree exactly with the internal Dracula database (DDB) layer numbers.

All Dracula database (DDB) layer names limited to 8 characters. First DDB layer name character must be one of a to z, or A to Z. DDB layer name characters 2 to 8 may be a-z, A-Z, or a number from 0 to 9.
   DDB layer name examples: POLY, pdiff, ALA, M1, MET12345

ALA = 3; metal 1
   ALB = 4; metal 2

POLY = 25; poly
   plya = 23;
   cplyb = 24;

CONT = 12; contact
   thol = 15; contact hole

NDIFF = 31; n diffusion
   PDIFF = 32; p diffusion

*FIG. 8.*

```
*Technology;; Technology block
   All layer names in this section must agree exactly with
   the internal Dracula database (DDB) layer names.

Interconnection ALA:; Interconnection ALB:;
   thickness= 0.8;;
   oxide-thickness = 1.2
   oxide-permitivity = 3.2;; relative permitivity
   sheet-resistance = 0.001 ohm;;
   cap=environment-range = 5; um Interconnection PLYA:; Interconnection CPLYB:;
   thickness= 0.45;;
   oxide-thickness = 1.2
   oxide-permitivity = 3.2;; relative permitivity
   sheet-resistance = 0.001 ohm;;
   cap-environment-range = 5; um Contact hole; Contact cont; Contact pbcon; Contact thol;
   resistance = 0.001 ohm;
   capacitance = 0.5 ff substrate sub; semiconductor substrate
   sheet-resistance = 2.1 ohm;
   capacitance = 0.9 ff mos p
   device = pgate;
   drain  = pdiff    sheet-res = 3.0
   source = pdiff    sheet-resistance = 3.0
   gate   = plya   oxide-thick = 0.45 oxide-per = 3.2 mos n
   device = ngate;
   drain  = ndiff    sheet-res = 4.0
   source = ndiff    sheet-resistance = 4.0
   gate   = plya   oxide-thick = 0.45 oxide-per = 3.2
```

*FIG. 9.*

**\*CONNECTIVITY**

The connect-layer-sequence specifies the sequence of semiconductor interconnect layers from bottom to top.

connect-layer-sequence = ndiff pdiff plya cplyb ala alb

The connect statement defines how layera is connected to layerb by way of contact type:
Example: connect layera layerb by contact-type

```
connect ala    alb    by hole
connect ala    plya   by cont
connect plya   cplyb  by thol
connect ala    ndiff  by cont
connect ala    pdiff  by cont
connect plya   ndiff  by pbcon
connect cplyb  ndiff  by thol
```

*FIG. 10.*

CONNECTIVITY-BASED APPROACH FOR EXTRACTING PARASITIC LAYOUT IN AN INTEGRATED CIRCUIT

Microfiche Appendix A comprising the one sheet and 64 frames is included in this application.

BACKGROUND OF THE INVENTION

The present invention relates to the field of designing and fabricating integrated circuits. More specifically, the present invention relates to a system for extracting layout parasitics.

Integrated Circuit Design and Fabrication

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer designs the integrated circuit by creating a circuit schematic indicating the electrical components and their interconnections. Generally, designs are simulated by computer to verify functionality and ensure performance goals are satisfied.

Integrated circuits are typically fabricated using a photolithography technique where a semiconductor material is selectively exposed to light by using masks. The exposed (or unexposed) areas of the semiconductor material are processed to form the features of the integrated circuit such as transistors and interconnects. Processing continues layer by layer until all the layers of the integrated circuit are formed.

Each mask contains the geometries for a particular layer of the integrated circuit. For example, a geometry may be used to form the metal interconnection between two transistors. To generate the masks for an integrated circuit, the circuit designer first creates a layout of the electrical components that implements the design in a circuit schematic. This layout is generally contained in a computer database having all the geometries for all mask layers. From this computer database, the masks are generated.

The layout of an integrated circuit contains parasitic resistances and capacitances from the interconnections and devices. The values of these parasitics depend on the process parameters, shape and dimensions of a particular geometry, and relationship of a particular geometry to other geometries. These parasitics affect the performance and possibly the functionality of an integrated circuit. Consequently, during the design phase of an integrated circuit, these parasitics are extracted from a layout and taken into consideration during circuit simulation. Two conventional approaches for extracting layout parasitics are the full-chip Boolean operation method and direct simulation method.

The Full-Chip Boolean Operation Method

The full-chip Boolean operation method extracts full-chip layout parasitics. It is based on Boolean operations in which the user specifies all combinations of each individual layer as a Boolean operation and gives the coefficient value in the command file. To develop these Boolean operations requires a programmer who will be required to write the custom equation for each design. As chips continue to increase in size and functionality, so does the time and effort required to develop the correct Boolean operation.

The approach of using Boolean operations to calculate resistance and capacitance parasitic data was developed over fifteen years ago. The simple formulas generated by this approach were previously sufficient for design. However, as feature sizes of VLSI chips approach 0.5 micron and smaller, this approach can not extract layout parasitics information accurately enough to meet the performance requirements for interconnect simulations and timing analysis of present-day high-performance VLSI designs.

This full-chip Boolean operation method is typically performed as a batch extraction and uses the command file to extract parasitic capacitances for the entire integrated circuit. Consequently, this becomes very time consuming because the approach computes parasitic resistance and capacitance value for geometries in total isolation.

A user who desires only to extract data on a particular net, such as clock net, must extract an entire integrated circuit to get the desired information. After this information is obtained and analysis is performed on the net, the user will want to make changes if the targeted performance goal is not achieved. After any changes are made, a user will need to extract the entire design once again to perform the required analysis. These design iterations can take weeks to complete. Even if this method is successfully used, the user cannot generate a complete distributed RC netlist (which provide greater accuracy) suitable for timing or interconnect simulation.

The above approach also uses textual data to pass information to and from the extraction process. Another disadvantage of the full-chip Boolean net is that a user cannot select a net for extraction. Furthermore, there is no graphical interface or viewer that permits a user to view the design or highlight and select a net or block for extraction of the parasitic data. A user must extract the entire design each time a change is made to the layout or extraction is required on any part of the chip.

The Direct Simulation Method

The direct simulation method has been implemented to extract small-area layout parasitics. It is based on user specifying extraction for an area or region of an integrated circuit. This area is then divided into smaller areas which a field solver can simulate. However, a drawback is that the field solver takes a long time to simulate even small areas. Consequently, this approach is limited to small-area parasitic extraction. Although some improvements to field solvers have been made, extraction time is still excessive. Furthermore, a field solver approach cannot generate a complete net-by-net distributed RC netlist including transistor parameter timing or power simulation.

As the feature sizes of integrated circuits are shrinking, operating frequencies of integrated circuits are increasing, and number of transistors per integrated circuit is increasing, performance of integrated circuits depend more on layout parasitics, especially the layout parasitics of interconnect. Furthermore, since number and complexity of integrated circuits continues to increase, there is a need for better, faster, more accurate, and improved layout parasitics extraction methods.

SUMMARY OF THE INVENTION

A layout parasitic extraction system is disclosed. The system may be coupled with layout network connectivity extraction (NCE) or layout versus schematic checker (LVS) to allow net-by-net layout parasitic extraction under user input without again requiring whole chip connectivity extraction.

The system takes user specified information to automatically create an extraction routine for the particular design. The system can display the design to allow for interactive extraction at the net, block, or integrated circuit level. The system uses the layout net or net number to extract selected net parasitics in conjunction with a file of transistors to create a complete netlist for timing simulation.

The present invention uses a lookup library of predefined geometries to minimize extraction time and adds any new geometries discovered during extraction to the lookup library. The system calls the parasitic simulator directly to calculate the value and updates the library. After the simulator calculates the required value, the system provides a netlist to other third-party simulators for further analysis and simulation.

Further features of the invention, its nature and various advantages will become more apparent from the accompanying drawings and following detailed description of the preferred embodiments.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

FIG. 6 is a system commands functional block of a sample technology file.

FIG. 7 is a library commands functional block of a sample technology file.

FIG. 8 is a display commands functional block of a sample technology file.

FIG. 9 is a technology commands functional block of a sample technology file.

FIG. 10 is a connectivity commands functional block of sample technology file.

DESCRIPTION OF THE PREFERRED EMBODIMENT

Figure 1A:
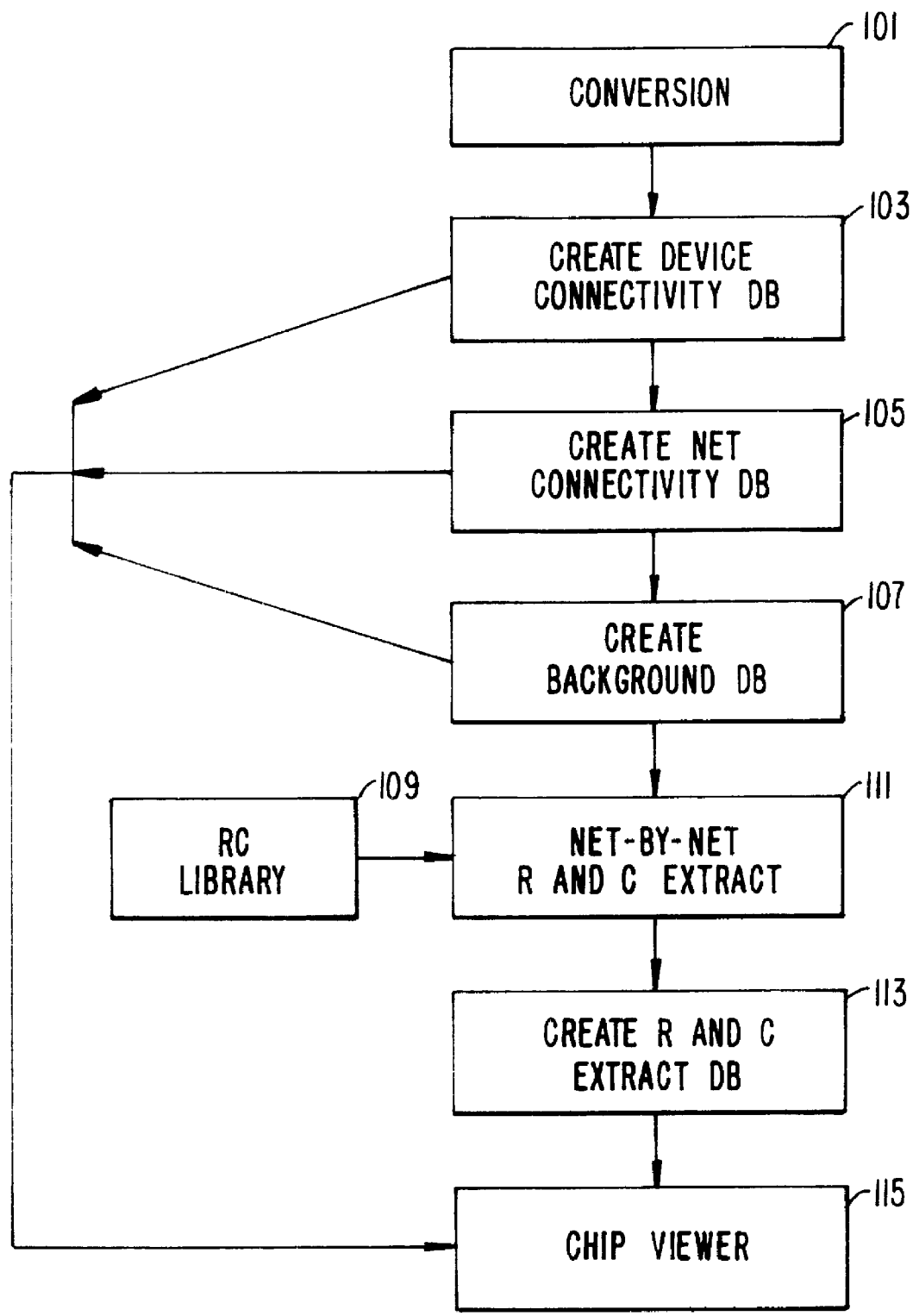
FIG. 1A is a flow diagram of the overall layout parasitics extraction system of the present invention.

FIG. 1A is an overall flow diagram of the layout parasitics extraction method of the present invention. The flow in FIG. 1A may be performed on a general-purpose computer or computing machine specially adapted for layout parasitics extraction. For example, the ARCADIA™ source code in C++ language in Appendix A is an implemention of an embodiment of the present invention for a general-purpose computer.

In the design of an integrated circuit, a user creates a circuit schematic and a layout of the integrated circuit. The circuit schematic is a database containing the design, while the layout is a database containing the geometries and layers for the integrated circuit. The circuit schematic may be in a netlist format; a common layout database format is GDSII.

A first step in the present layout parasitics extraction method is Conversion 101, which generates a connectivity-based database file where geometries of the layout are referenced according to the circuit schematic by net. A net is a connection or node of the circuit schematic and connects the electrical components or devices of the design. A net may have a unique net number or net name. In another embodiment of the invention, Conversion 101 starts with a layout-versus-schematic (LVS) database where the circuit schematic is organized by geometries of the layout and converts this LVS database into a connectivity-based database. Regardless of the starting point, the result of Conversion 101 is to create a database where geometries of the layout are referenced according to the circuit schematic by net.

The connectivity-based database may be contained in more than one database file. For example, in the embodiment shown in FIG. 1A, the result of Conversion 101 is to create a Device Connectivity Database 103, Net Connectivity Database 105, and Background Database 107. The Device Connectivity Database 103 is a database organized by devices of the integrated circuit. The Net Connectivity Database 105 is a database organized by nets of the integrated circuit. The Background Database 107 is a database containing environment information regarding structures of the integrated circuit. In this embodiment, these three databases collectively comprise a connectivity-based database of the present invention.

After Conversion 101, a user may go to Chip Viewer 115 to view the layout or circuit schematic of the integrated circuit on a graphics display. In one embodiment, Chip Viewer 115 provides an interactive graphics display of nets, trees, and blocks in a connectivity-based database. A user can view selected layers, net paths, signal paths, and blocks. Chip Viewer 115 also automatically selects complex clock trees. Moreover, Chip Viewer 115 provides full zoom and pan capabilities. A user can also view extracted resistance and capacitance values. Furthermore, with Chip Viewer 115, a user can select a net or nets graphically for extraction by Net-by-Net R and C Extract 111. A user may also select a net by entering a schematic net name and layout net number, or schematic block name.

After Conversion 101, a user may, instead of going to Chip Viewer 115, go to Net-by-Net R and C Extract 111, which extracts the parasitic resistances and capacitances of the layout of the integrated circuit using a connectivity-based database created during Conversion 101. Net-by-Net R and C Extract 111 proceeds by extracting layout parasitics net by net. Net-by-net R and C Extract 111 allows extraction at the net, cell, block, and entire integrated circuit levels. For example, a user may extract a selected net or nets that were selected during Chip Viewer 115. When extracting at a level comprising repeated cells (e.g., block and entire integrated circuit levels), Net-by-Net R and C Extract 111 will use parasitics data previously determined so that each cell will only be extracted once. A more detailed description of Net-by-Net R and C Extract 111 is given below in the discussion of FIG. 2.

In addition to a connectivity-based database, Net-by-Net R and C Extract 111 also utilizes RC Library 109 containing files, definitions, and libraries which include information on the process technology and parasitics for predefined structures. A more detailed description of RC Library 109 is given below in the discussion of FIG. 3.

Create R and C Extract Database 113 creates a R and C extract database of the parasitic resistance and capacitance values extracted during Net-by-Net R and C Extract 111. Chip Viewer 115 allows viewing of data in R and C Extract Database 113. For example, a user can view graphically the extracted resistance and capacitance values.

Furthermore, other software (possibly from a third party) may use the R and C Extract Database 113 to provide other data pertinent for the design and fabrication of integrated circuits. In one embodiment, the R and C Extract Database 113 may be back annotated into the circuit schematic to allow circuit simulation with extracted parasitics. Other examples include clock skew analysis, power net analysis, electromigration analysis, characterization of cells, coupling effects between digital and analog sections of mixed signal integrated circuits, critical path analysis, timing analysis, and multiple signal race condition analysis.

Figure 1B:
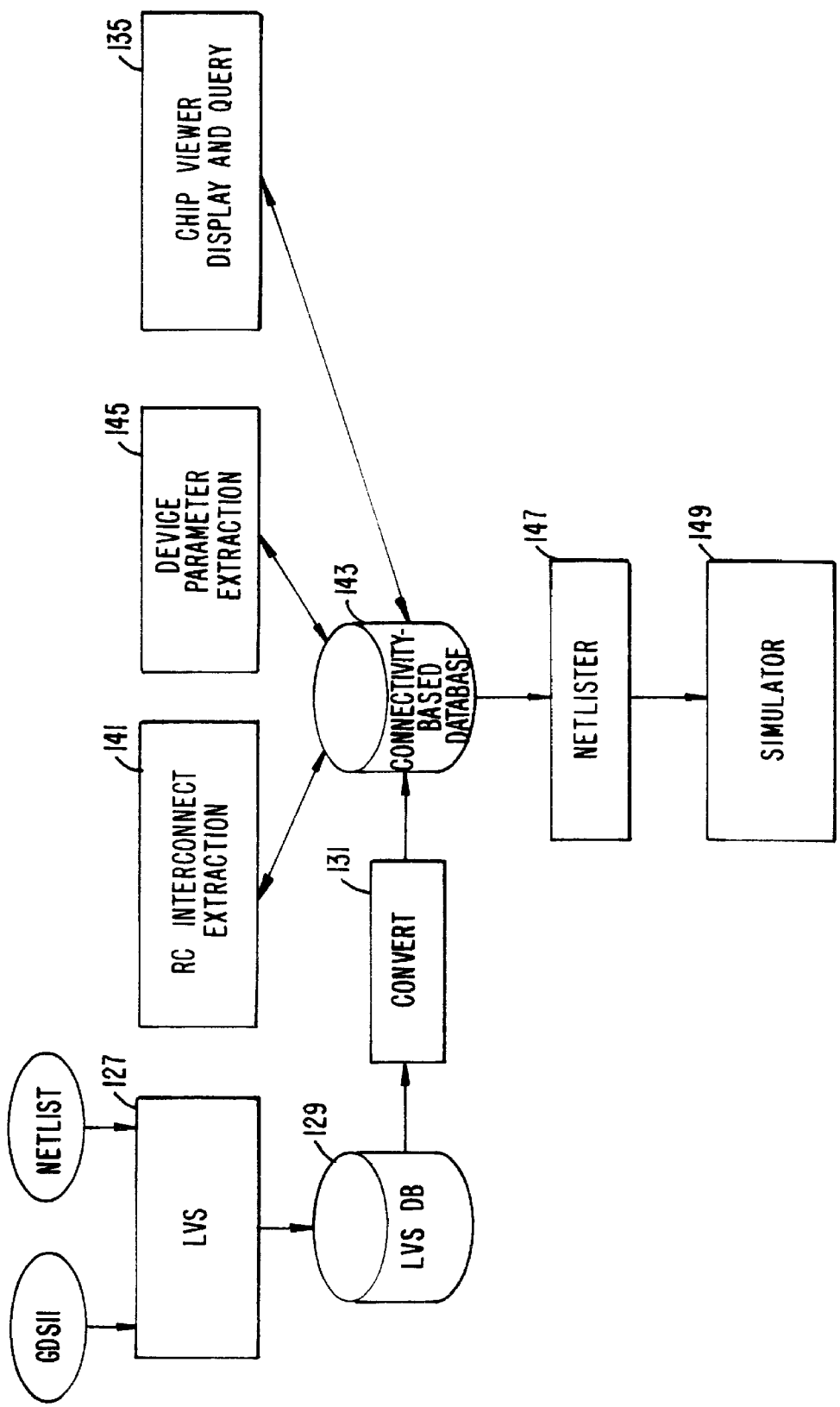
FIG. 1B is a flow diagram of another embodiment of the overall layout parasitics extraction system of the present invention.

FIG. 1B is an overall flow diagram of another embodiment of the parasitics extraction system of the present invention. In this embodiment, LVS 127 generates an LVS database 129 from GDSII and Netlist files. Convert 131 converts this LVS database 129, where nets of an integrated circuit are organized by geometries of the layout, into a Connectivity-Based Database 143, where the geometries of the layout are organized by nets of the integrated circuit. Using Connectivity-Based Database 143, RC Interconnect Extraction 141 extracts layout parasitics for selected nets or an entire integrated circuit and creates a database containing the extracted parameters for the selected nets. Also using Connectivity-Based Database 143, Device Parameter Extraction 145 will extract device parameters including width, length, area of source, area of drain, perimeter of source, perimeter of drain, net resistance of drain, and net resistance of source.

Chip Viewer 135 is used to display and query the Connectivity-Based Database 143 and is similar to Chip Viewer 115 of FIG. 1A. A user may use Chip Viewer 135 to view the layout or circuit schematic of the integrated circuit on a graphics display. In one embodiment, Chip Viewer 135 provides an interactive graphics display of nets, trees, and blocks in the connectivity-based database. The user can view selected layers, net paths, signal paths, and blocks. Chip Viewer 135 also automatically selects complex clock trees. Moreover, Chip Viewer 135 provides full zoom and pan capabilities. A user can also view extracted resistance and capacitance values. Furthermore, with Chip Viewer 135, a user can graphically select a net or nets for extraction by RC Interconnect Extraction 141. The user may also select a net by entering a schematic net name and layout net number, or schematic block name.

From Connectivity-Based Database 143, Netlister 147 will generate a netlist format file of the extracted parasitic resistance and capacitance values. These extracted parasitic values may be back annotated into the circuit schematic for circuit simulation. Also, other applications software may use the netlist format file to produce other integrated circuit analyses including clock skew analysis, power distribution analysis, timing analysis, electromigration analysis, coupling analysis, power ground bounce analysis, and inductance analysis.

Figure 2:
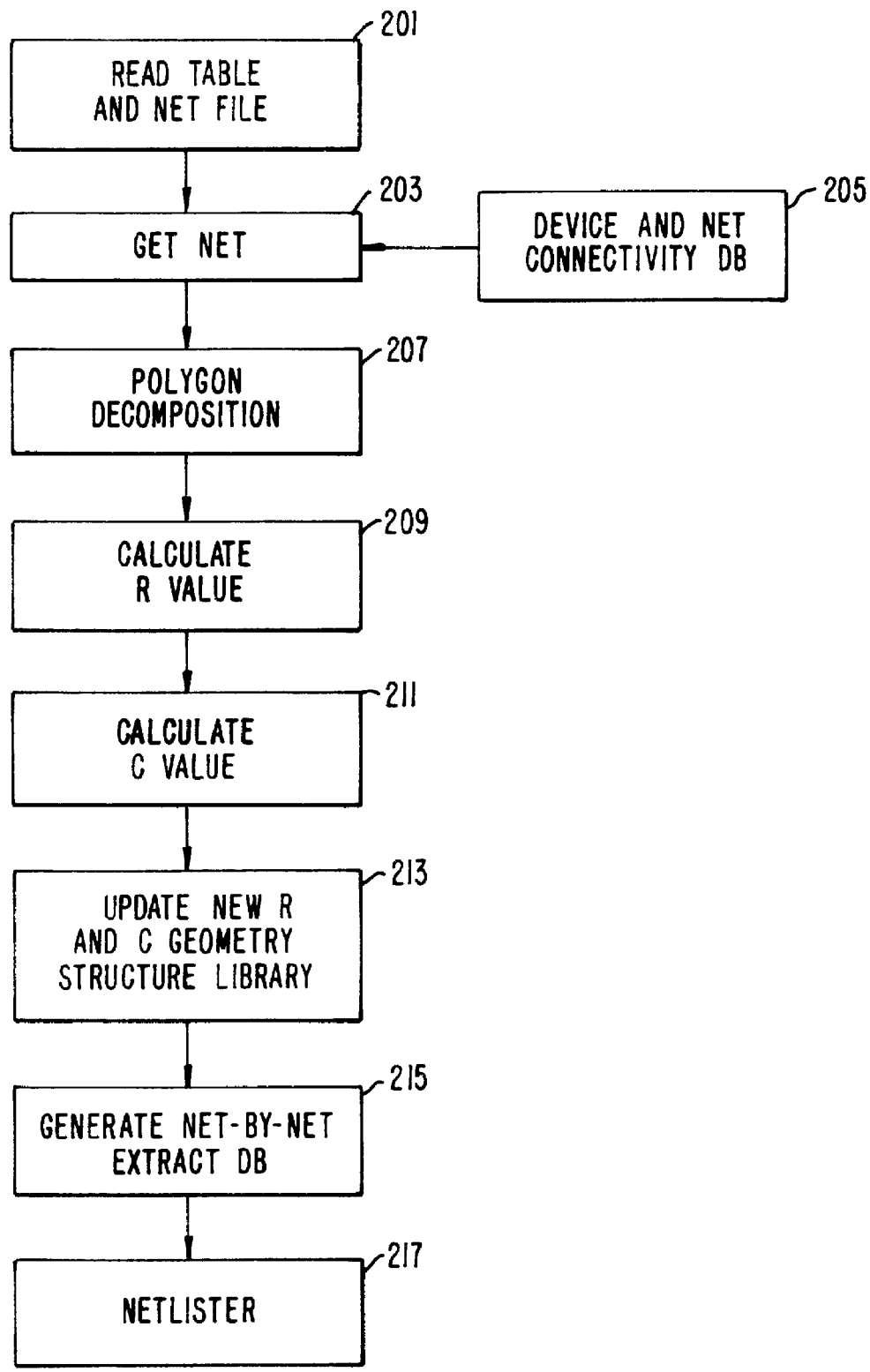
FIG. 2 is a flow diagram of the Net-by-Net Resistance and Capacitance Extraction Method of the present invention.
Figure 3:
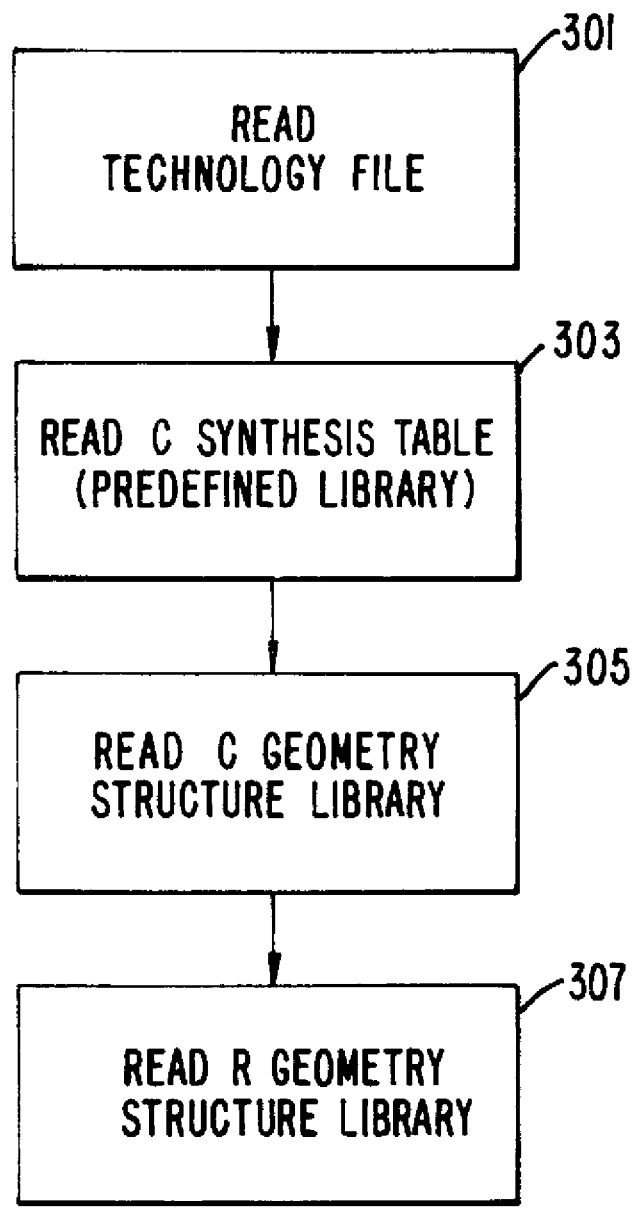
FIG. 3 is a flow diagram of the Read Table and Net File method of the present invention.

FIG. 2 is a more detailed flow diagram of the Net-by-Net R and C Extract 111 step of FIG. 1A. Read Table and Net File 201 generally reads information about the integrated circuit process, predefined structures, and previously extracted structures. A more detailed flow of Read Table and Net File 201 is shown in FIG. 3. In FIG. 3, a technology file 301 is read, a C Synthesis table 303 is read, a C Geometry Structure Library 305 is read, and a R Geometry Structure Library 307 is read. Read Technology File 301 reads a process technology file which contains information about the parameters of the particular process used to fabricate the integrated circuit. For example, for an interconnection layer, a user may specify the thickness of that layer, sheet resistance, and capacitance environment range. As another example, for a MOS transistor, a user may specify the sheet resistance of the p-diffusion and the oxide thickness of the gate.

C synthesis table 303 is a predefined library with predefined structures where capacitance values have already been calculated. C Geometry Structure Library 305 contains capacitance values for structures previously extracted by a user. R Geometry Structure Library 307 contains parasitic resistance values for structures extracted previously by the user. Structures found in the C Synthesis Table 303, C Geometry Structure Library 305, or R Geometry Structure Library 307 will not need to be re-extracted.

In FIG. 2, after Read Table and Net File 201, the next step is Get Net 203, which involves getting the structures connected to a net or selected net. A user may have previously selected this net, possibly by using Chip Viewer 115 of FIG. 1A, as described above. Get Net 203 utilizes the connectivity-based database 205 (comprising device and net conductivity databases) that was created in steps 103 and 105 of FIG. 1A.

After a particular net and its related structures are designated for extraction, the next step is polygon decomposition 207 which involves breaking down a particular structure into smaller, easier to extract pieces. For example, A long rectangular polygon is broken down into smaller squares or rectangular structures. In later steps of the flow in FIG. 2, the resistance and capacitance values are extracted and calculated for these smaller polygons.

In order to properly account for equipotential lines of current, special decomposition techniques must be used to break up irregularly shaped polygons. Irregularly shaped polygons are generally those that are not square or rectangular. In an embodiment of the present invention, for irregularly shaped polygons, Polygon Decomposition 207 selects breakpoints a distance W/2 in opposite directions from the irregular polygon. In the end, the decomposed polygon includes the irregular polygon and two W/2 portions. When extracted, this decomposed polygon will properly account for equipotential lines of current. A more detailed description of decomposition of an irregular polygon accompanies the discussion of FIG. 15 below.

In another embodiment of the present invention, Polygon Decomposition 207 decomposes nets and structures into smaller sections or pieces to allow for distributed RC modeling of the layout parasitics. In practice, long nets do not have a simple parasitic resistance and parasitic capacitance component, but rather resistances and capacitances distributed along the entire length of the net. In order to accurately model distributed RC, nets must be broken up into smaller sections and extracted individually. Generally, the smaller the decomposed sections, the greater the accuracy of the distributed RC model. The distributed RC modeling of the present invention allows for more accurate modeling of layout parasitics. A more detailed discussion of distributed RC modeling of the present invention accompanies the description of FIG. 11.

After Polygon Decomposition 207, the next step is Calculate R Value 209 which calculates the parasitic resistance value of the selected structure or net. A more detailed description of how parasitic resistances are calculated is given below in the discussion regarding FIG. 4.

After a parasitic resistance has been determined, the next step, Calculate C Value 211, calculates the parasitic capacitances of the selected structure or net. A more detailed description of Calculate C Value 211 is given below in the discussion regarding FIG. 5. After Calculate R Value 209 and Calculate C Value 211, the parasitic resistances and parasitic capacitances for the selected structure or net have been determined, either from extraction and calculation or finding a similar structure in the C Synthesis Table 303, C Geometry Structure Library 305, or R Geometry Structure Library 307.

Then, Update New R and C Geometry Structure Library 213 updates the C Geometry Structure Library 305 and the R Geometry Structure Library 307 with any new structures that were extracted and calculated during Calculate R Value 209 and Calculate C Value 211. New structures are those not previously found in the C Synthesis Table 303, C Geometry Structure Library 305, or R Geometry Structure Library 307. During each iteration through Net-by-Net R and C Extract 111, new structures are learned and memorized in structure libraries so that in subsequent iterations, structures that match these just-determined new structures will not need to be re-extracted; calculated values from either the R Structure Library 305 or C Structure Library 307 will be used instead.

After Update New R and C Geometry Structure Library 213, Generate Net-by-Net Extract Database 215 generates a connectivity-based database containing the extracted parasitics. Netlister 217 uses this database to back annotate the parasitics extracted back into the circuit schematic database to allow circuit simulation of the integrated circuit with the extracted parasitics. Furthermore, using the Net-by-Net Extract Database 215, Netlister 217 can generate a netlist format file that can be used by software (possibly from a third-party) to provide other types of integrated circuit analyses such as clock skew analysis, power net analysis, electromigration analysis, characterization of cells, coupling effects between digital and analog sections of mixed signal integrated circuits, critical path analysis, timing analysis, and multiple signal race conditions analysis.

Figure 4:
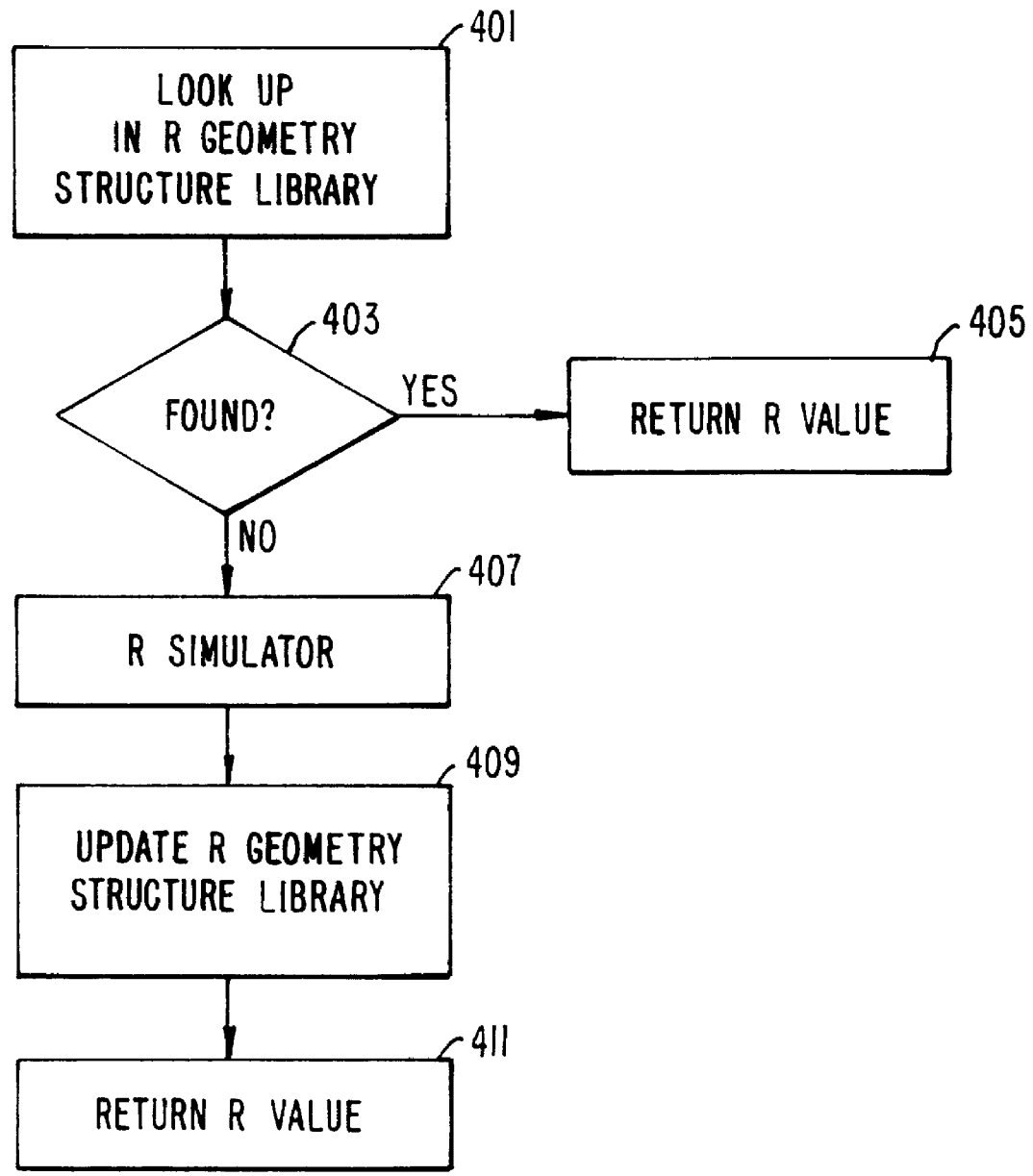
FIG. 4 is a flow diagram of the Resistance Value Calculation Method of the present invention.

FIG. 4 shows a more detailed flow diagram of Calculate R Value 209 of FIG. 2. In FIG. 4, Lookup in R Geometry Structure Library 401 first looks at the R Geometry Structure Library 307 of FIG. 3. If the selected structure, geometry, or net is found (Found 403) in Library 307, no further extraction needs to be performed and the resistance value in R Geometry Structure Library 307 is returned (Return R Value 405).

If the selected geometry, structure, or net is not found (Found 403), however, then R Simulator 407 simulates the selected geometry, structure, or net to calculate and determine the parasitic resistance of the structure. Then, Update R Geometry Structure Library 409 updates the R Geometry Structure Library with this new structure. In subsequent iterations through Calculate R Value 209, on occurrences of a similar structure or structures, R Simulator 407 will not re-extract and recalculate the parasitic resistance, but instead return the parasitic resistance value (Return R Value 405) found in the R Geometry Structure Library 401. After R Geometry Structure Library 409, the parasitic resistance value of the new structure is returned (Return R Value 411).

Figure 5:
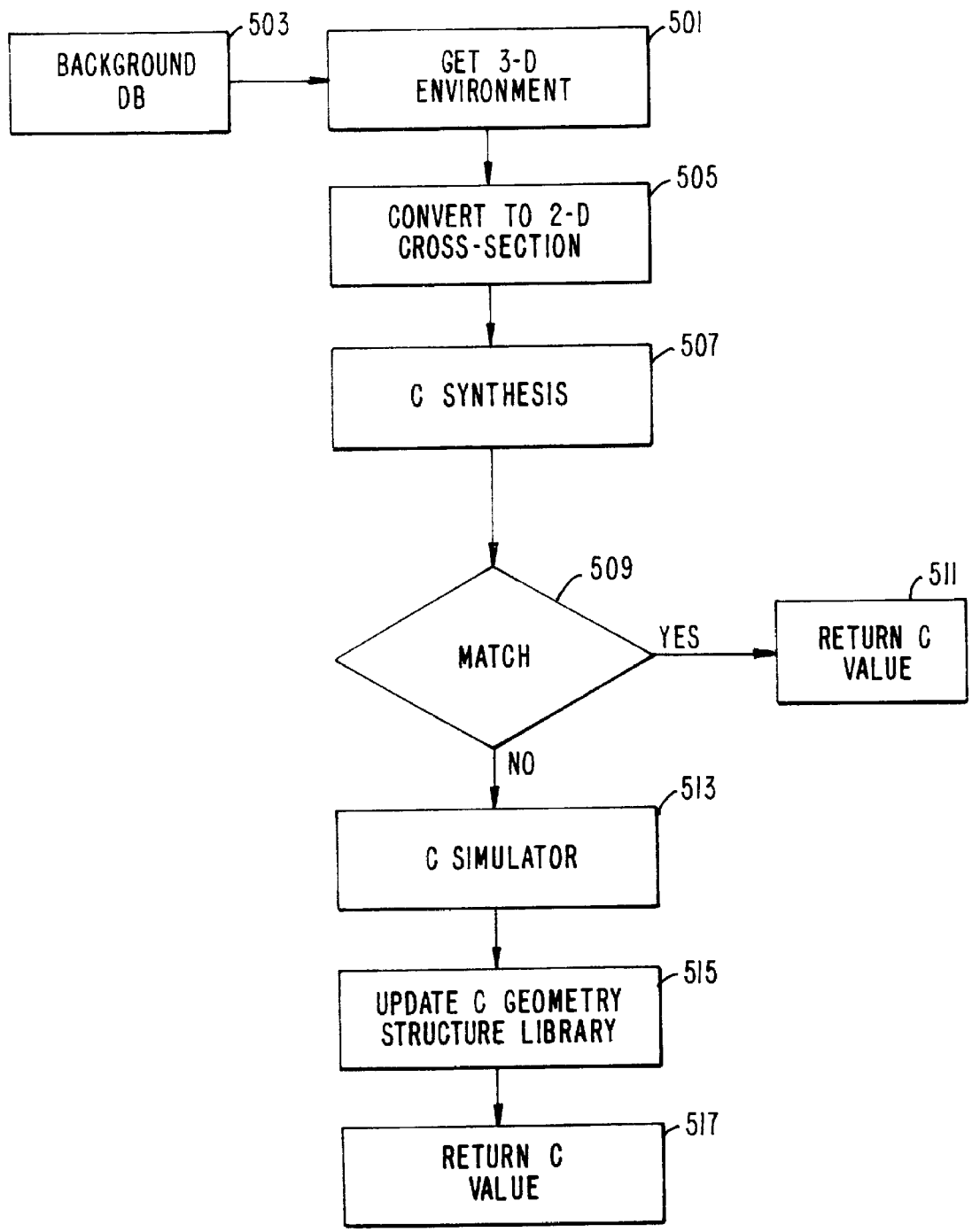
FIG. 5 is a flow diagram of the Capacitance Value Calculation Method of the present invention.

FIG. 5 is a flow diagram of Calculate C Value 211 of FIG. 2. Get 3-D Environment 501 gets the three-dimensional environment information for the selected geometry, structure, or net. For parasitic capacitance, lateral, fringe, and area capacitances all contribute to the capacitance of a particular structure. For example, if there are three layers of metal interconnect surrounding a selected structure, each of these metal interconnect layers contribute some amount of lateral and fringe capacitances to the selected structure. This information cannot be obtained solely from a single layer of a layout database.

Get 3-D Environment 501 determines which layers contribute to the parasitic capacitance (i.e., fringe, area, and lateral effects) of a selected structure. Get 3-D Environment 501 uses Background Database 503 (i.e., Background Database 107 of FIG. 1A), which contains three-dimensional is information about the structures (i.e., "environment") surrounding a selected structure.

In an embodiment of the present invention, Get 3-D Environment 501 excludes structures that contribute relatively weak capacitance effects. For example, if there are three layers of metal interconnect surrounding a selected structure, each of these metal interconnect layers contribute some amount of lateral and fringe capacitances, but one of these metal interconnects is so much closer to the selected structure that it clearly dominates the parasitics. In this case, Get 3-D Environment 501 will "throw away" the other two metal interconnects since their parasitic effects are comparably minimal. A threshold for deciding whether to consider a structure as part of an environment is if the parasitic capacitance contribution of that structure is less than one-tenth of the parasitic capacitance contribution of another structure.

After all the particular structures that contribute or effectively contribute capacitance to a selected structure are determined, Convert to 2-D Cross Section 505 converts this three-dimensional environment information into a two-dimensional cross-sectional structure. C Synthesis 507 calculates a "signature," which is unique for a specific structure (cross section). Then, C Synthesis 507 consults a C Synthesis Table 303 of FIG. 3, containing parasitic capacitances for predefined structures. If the calculated signature matches (Match 509) a value in the C Synthesis Table 303, then the capacitance value for the predefined structure with the same signature will be returned and used (Return C Value 511).

Even if an exact signature match is not found, if a signature substantially matches, such as an ninety percent or greater match, C Synthesis 507 will calculate, by interpolating from structures with substantially similar signatures in the C Synthesis Table 303, a parasitic capacitance value for that selected structure. This value is returned and used (Return C Value 511).

If no signature match or substantial signature match is found in the C Synthesis Table 303, C Synthesis 507 consults the C Geometry Structure Library 305 of FIG. 3. As described above, C Geometry Structure Library 305 contains parasitic capacitance values for previously extracted structures. If an exact signature match is found in the C Geometry Structure Library 305, the parasitic capacitance value found in this library will be used. If there was a match (Match 507) in C Synthesis 507, that particular parasitic capacitance value is returned (Return C Value 511).

If there was no signature match, the selected structure must be a new structure not found in either the C Synthesis Table 303 or C Geometry Structure Library 305. C Simulator 513 will calculate the parasitic capacitance value for this new structure. Depending on the degree of accuracy desired, C Simulator 513 may utilize any capacitance modeler or simulator; C Simulator 513 may even use a field solver.

After C Simulator 513 calculates a parasitic capacitance value for a new structure, Update C Geometry Structure Library 515 updates the C Geometry Structure Library 305 of FIG. 3 with the signature of the new structure and its calculated parasitic capacitance value. In subsequent runs through Calculate C Value 211, during C synthesis 507, if the signature of a structure matches the signature of this new structure, the parasitic capacitance value of this new structure will be used (Return C Value 511); C Simulator 513 will not need to calculate a capacitance value resulting in a time savings. After Update C Geometry Structure Library 515, the calculated parasitic capacitance value is returned (Return C Value 517).

FIGS. 6 through 10 are five functional blocks of a sample technology file. A technology file is read during Read Technology File 301 of FIG. 3. These files include basic information about the semiconductor process and additional information about generating resistance and capacitance models. In one embodiment, there are five functional blocks of the technology file: system commands (see FIG. 6), display commands (see FIG. 7), library commands (see FIG. 8), technology commands (see FIG. 9), and connectivity commands (see FIG. 10).

System commands (see FIG. 6) are those commands that specify parameters such as the file names to extract and the output file names. Library commands (see FIG. 7) are the block of the technology file used to specify the R and C geometry model library files. Display commands (see FIG. 8) are the block of the technology file used to define how the layers in the layout database (usually in GDSII format file) correspond to the process layers (e.g., p-diffusion, contact, metal 1, metal 2). Technology commands (see FIG. 9) are the block of the technology file used to specify physical process parameters such as contact resistance, oxide thickness, metal thickness, and p-diffusion resistance. Connectivity commands (see FIG. 10) are the block of the technology file used to specify the sequence of semiconductor interconnect layers from bottom to top and defines how these layers connect with each other.

Figure 11A:
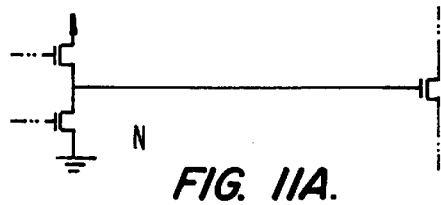
FIGS. 11A–J show circuit diagrams for ten network reduction models of the present invention.
Figure 11B:
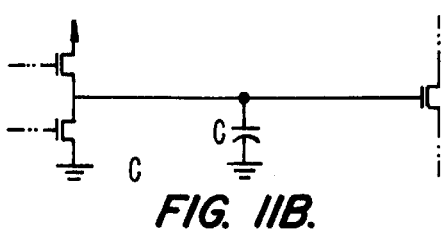
Figure 11C:
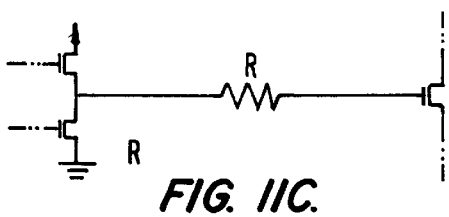
Figure 11D:
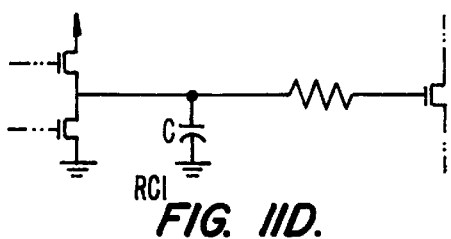
Figure 11E:
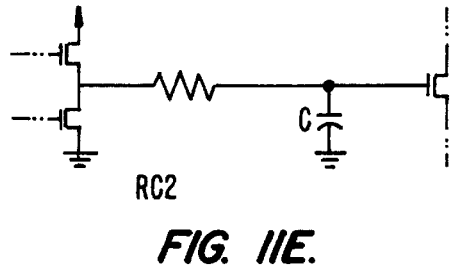

Using a connectivity-based database, the present invention can extract lumped distributed RC networks. Lumped distributed RC networks allow for more accurate modeling of layout parasitics, especially for long nets. FIGS. 11A through 11J show circuit diagrams for ten network reduction models of the present invention. FIGS. 11A through 11E are useful for extremely simple or short nets. FIG. 11A shows the N model, FIG. 11B shows the C model, and FIG. 11C shows the R model, FIG. 11D shows the RC1 model, and FIG. 11E shows the RC2 model. These models provide reasonable accuracy at modest computing costs for the simplest and lowest frequency nets.

Figure 11F:
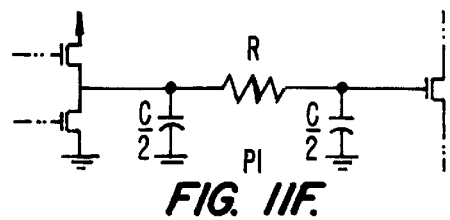
Figure 11G:
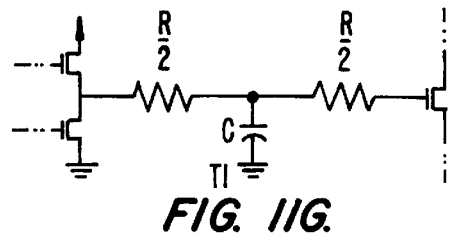
Figure 11H:
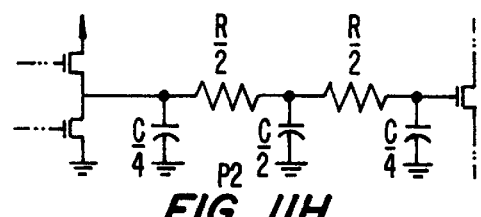
Figure 11I:
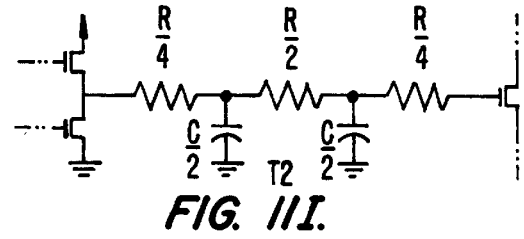
Figure 11J:
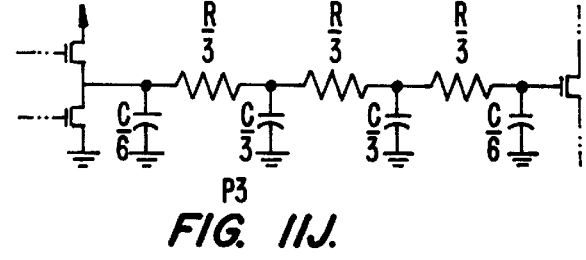

FIGS. 11F through 11J are for more complex and longer nets. FIGS. 11G and 11I are T-network models. FIG. 11G is a T1 model and FIG. 11I shows the T2 model. At lower frequencies on a net, the T1 model may be used, while at the higher frequencies, the T2 model should be used for greater accuracy. FIGS. 11F, 11H, and 11J are pi-network models. FIG. 11F shows the P1 model, FIG. 11H shows the P2 model, and FIG. 11J shows the P3 model. The P1 model is used for the lowest frequency nets. As the frequency of the signal on a net increases, the P2 or P3 model are used to provide greater accuracy.

Figure 12:
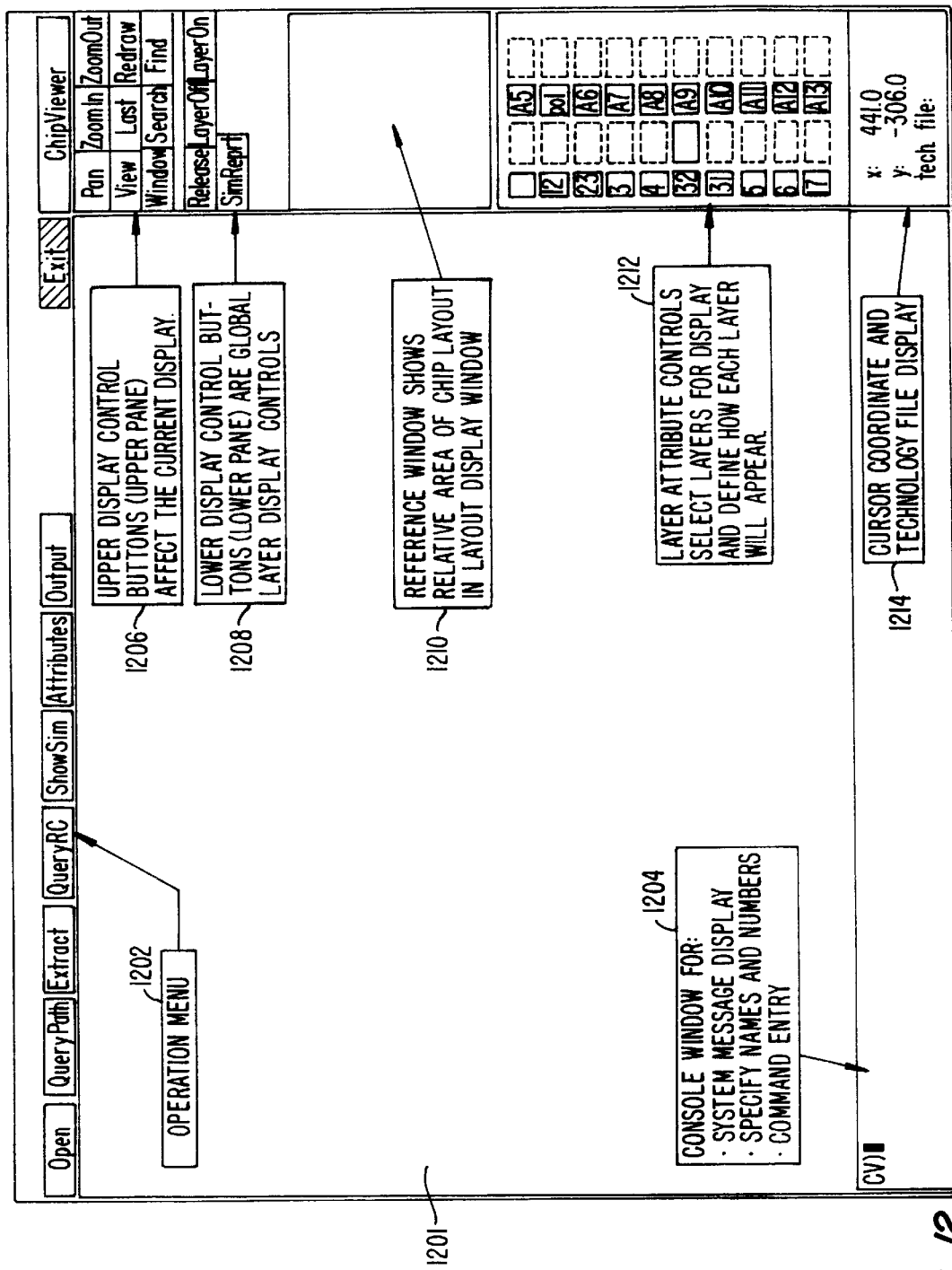
FIG. 12 shows a screen from a Chip Viewer graphical interface of the present invention.

FIG. 12 shows a screen from a Chip Viewer graphical interface of the present invention. Main Chip Layout Display Window 1201 can be used to display the layout of the integrated circuit. A user selects commands from a menu-driven Operation Menu 1202. Alternatively, a user may type commands into the Console Window 1204. Console Window 1204 is also used to display system messages and specify net names and numbers.

Upper Display Control Buttons 1206 are used to manipulate the current display in the Main Chip Layout Display Window 1201; the user can pan, zoom in, zoom out, redraw, search, find, view, and perform other such operations on the current display. Lower Display Control Buttons 1208 are global layer display controls to control whether certain layers are shown.

Reference Window 1210 shows the chip layout in the Main Chip Layout Display Window 1201 relative to the entire cell, block, or integrated circuit. Layer Attribute Controls 1212 selects layers for display and define how each layer will appear (e.g., shading and color). Cursor Coordinate and Technology File Display 1214 shows the current coordinates of the cursor and the name of the technology file being used.

Figure 13:
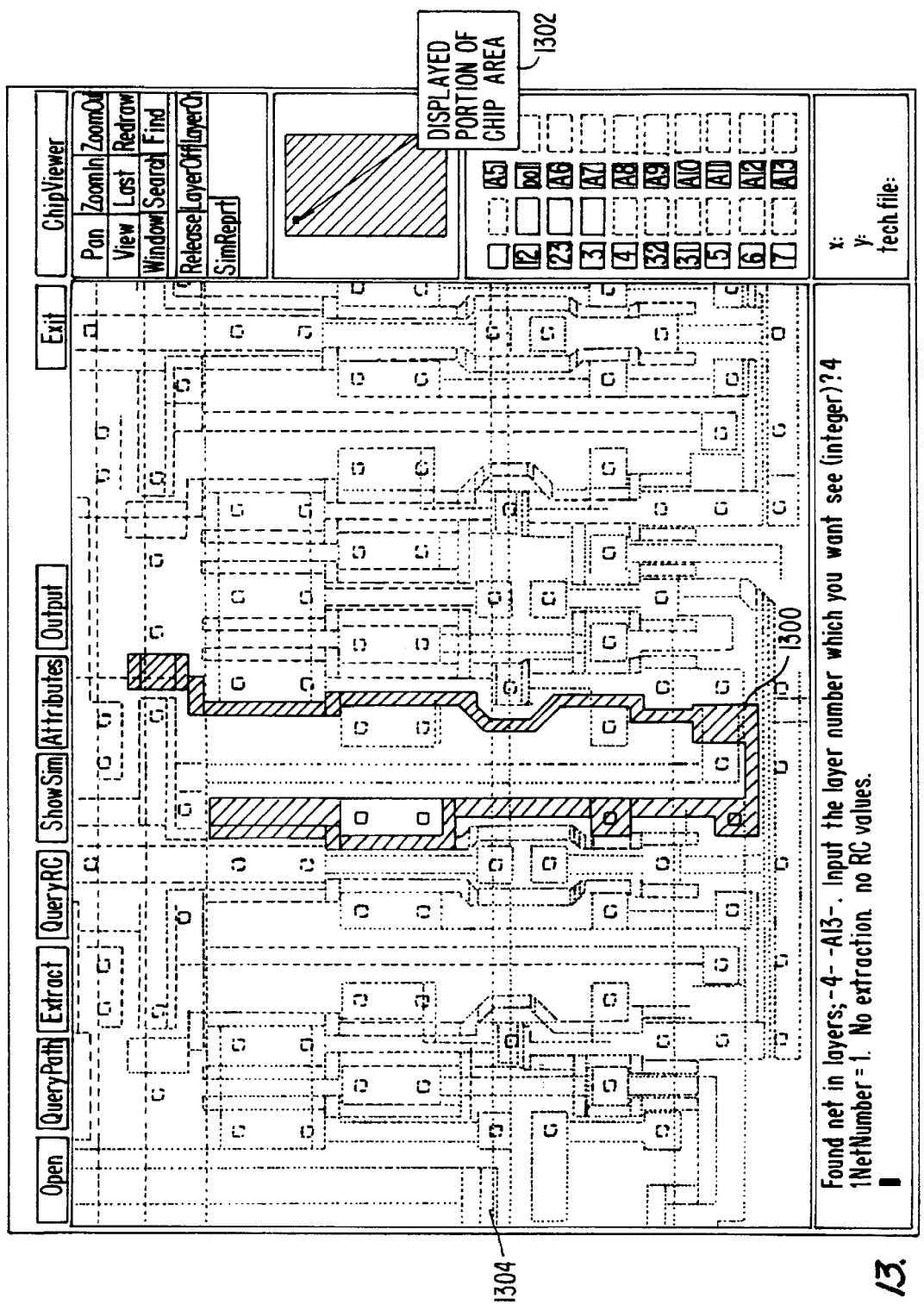
FIG. 13 shows a screen from a Chip Viewer graphical interface showing a selected net with the surrounding layout.

FIG. 13 shows a screen from a Chip Viewer graphical interface showing a selected net 1300 with the surrounding layout. Selected net 1300 is highlighted. The highlighting is selectable. On a color display, this highlighting may be in a white color. Reference Window 1302 shows the portion of the layout displayed portion in the Main Chip Layout Display Window 1304 in relation to the entire integrated circuit area.

Figure 14:
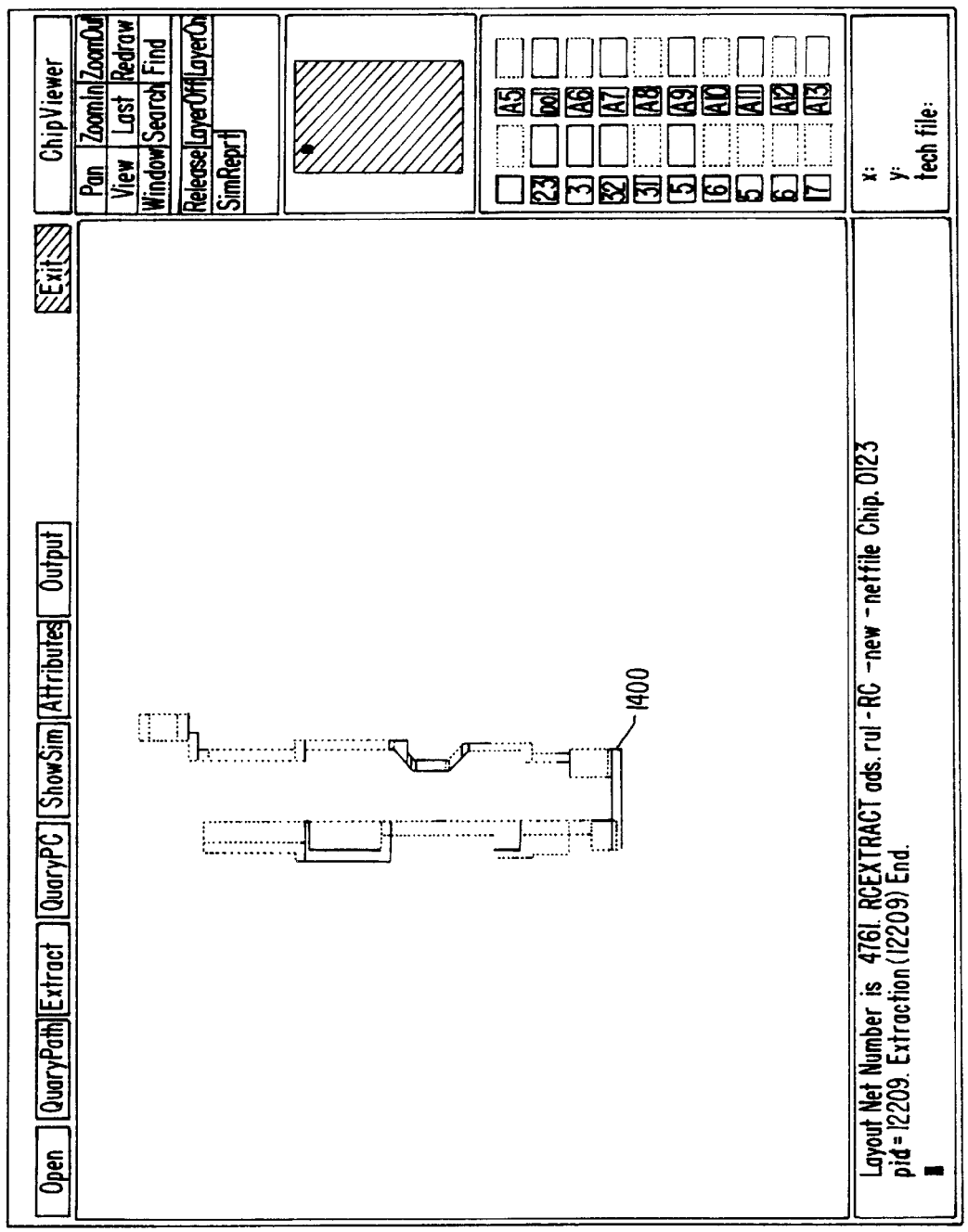
FIG. 14 shows a screen from a Chip Viewer graphical interface showing a selected net without the surrounding layout.

FIG. 14 shows a screen from a Chip Viewer graphical interface showing a selected net without the surrounding layout. Selected net 1400 is the same net as selected net 1300 of FIG. 13. In this embodiment, Chip Viewer can display selected net 1400 without the surrounding layout.

Figure 15:
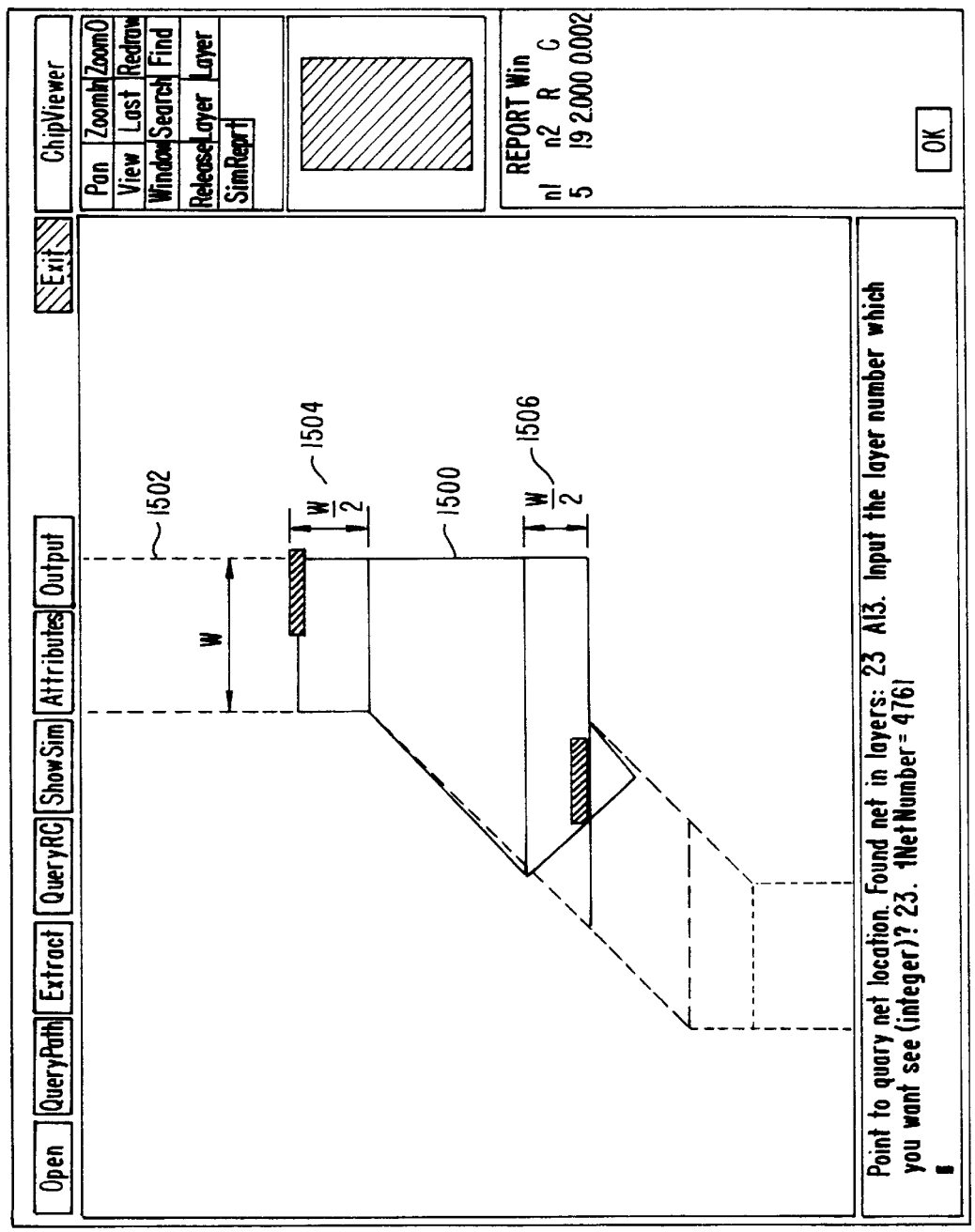
FIG. 15 shows a screen from a Chip Viewer graphical interface showing the selection of a highly irregular portion of a net.

FIG. 15 shows a screen from a Chip Viewer graphical interface showing the selection of a highly irregular portion 1500 of net 1502. Furthermore, FIG. 15 shows how Polygon Decomposition 207 of FIG. 2 breaks up an irregular net to properly account for equipotential lines of current so that accurate parasitics data will be extracted. First, the present invention determines the width W of net 1502. Then, the present invention breaks up irregular polygon 1500 at points 1504 and 1506, a distance W/2 in opposite directions from the irregular polygon. In the end, the decomposed polygon includes irregular polygon 1500 and two W/2 portions, 1504 and 1506. When extracted, this decomposed polygon will properly account for equipotential lines of current.

Figure 16:
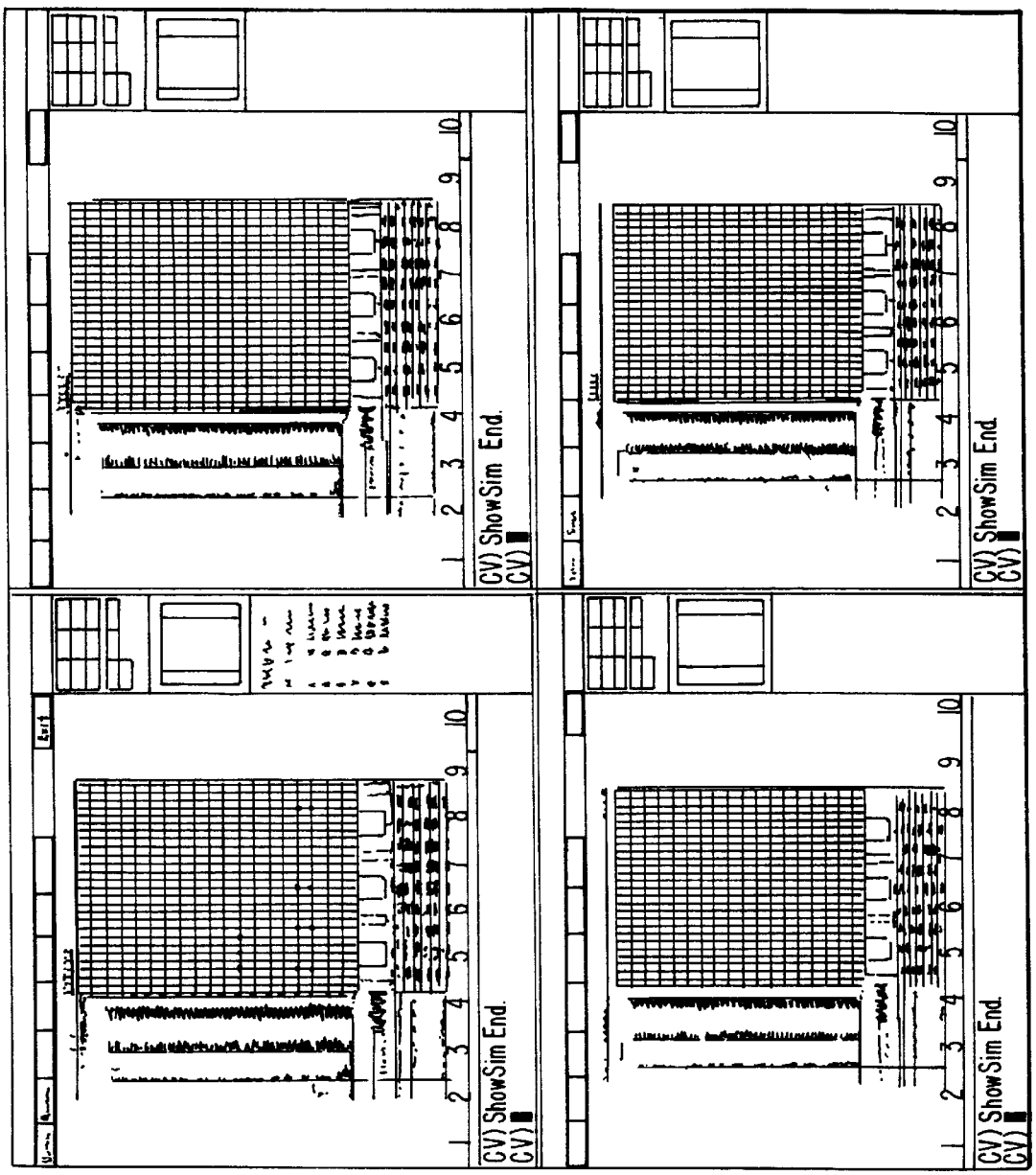
FIG. 16 shows four screens from software analyzing power distribution for an integrated circuit using the Netlister output of the present invention.

FIG. 16 shows four screens from software analyzing power distribution for an integrated circuit using output from Netlister 147 of FIG. 1B of the present invention. The screens in FIG. 16 show a power distribution simulation, which is useful in determining which nets and interconnects on an integrated circuit have an unusually high current density, leading to a electromigration problem.

Figure 17:
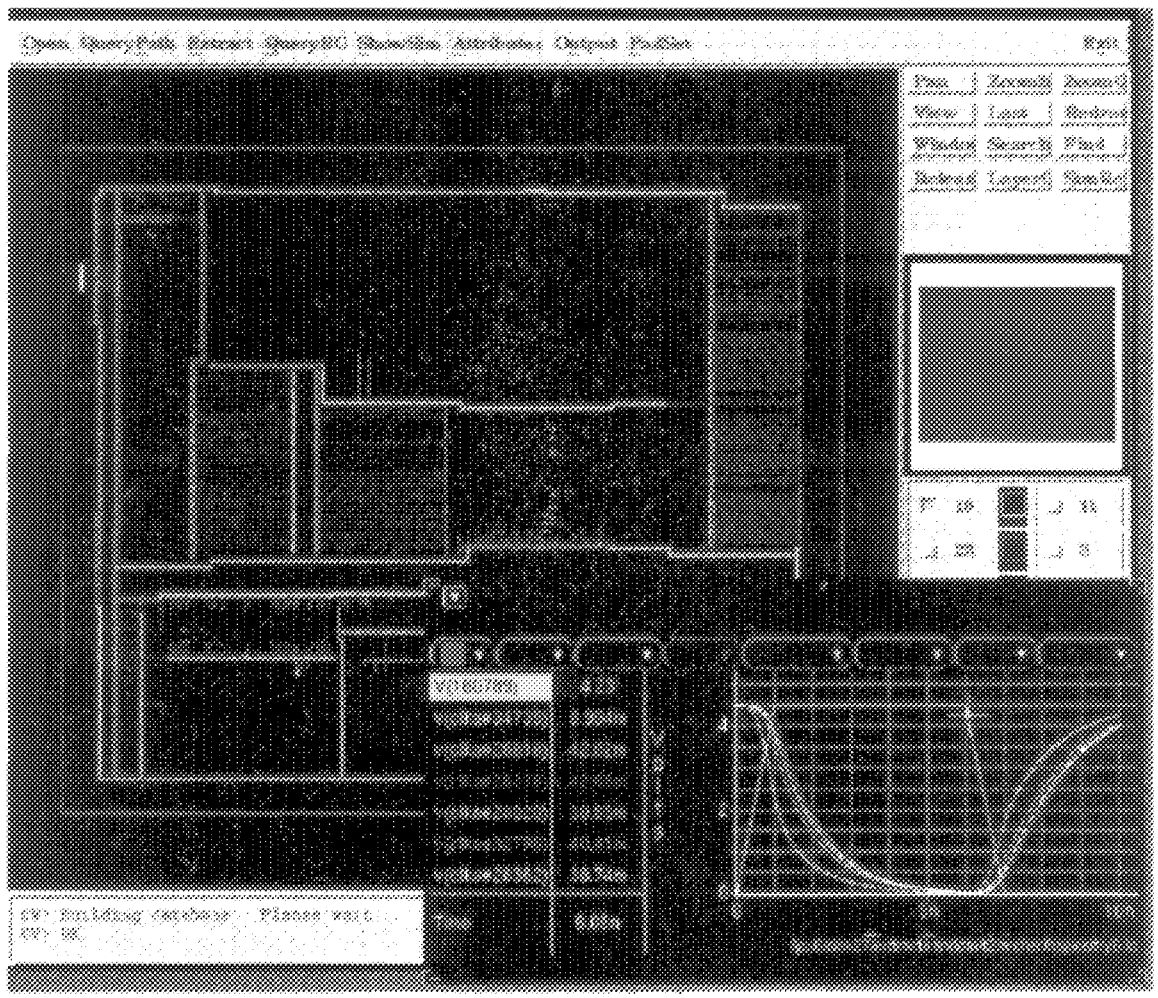
FIG. 17 shows a color screen from Chip Viewer of clock signal analysis of the present invention.

FIG. 17 shows a color screen from Chip Viewer of a clock signal analysis of the present invention. FIG. 17 shows how timing analysis is performed for an integrated circuit, after taking into account the layout parasitics on a clock net. The layout parasitics for the clock net were back annotated into the circuit schematic to allow circuit simulation.

Figure 18:
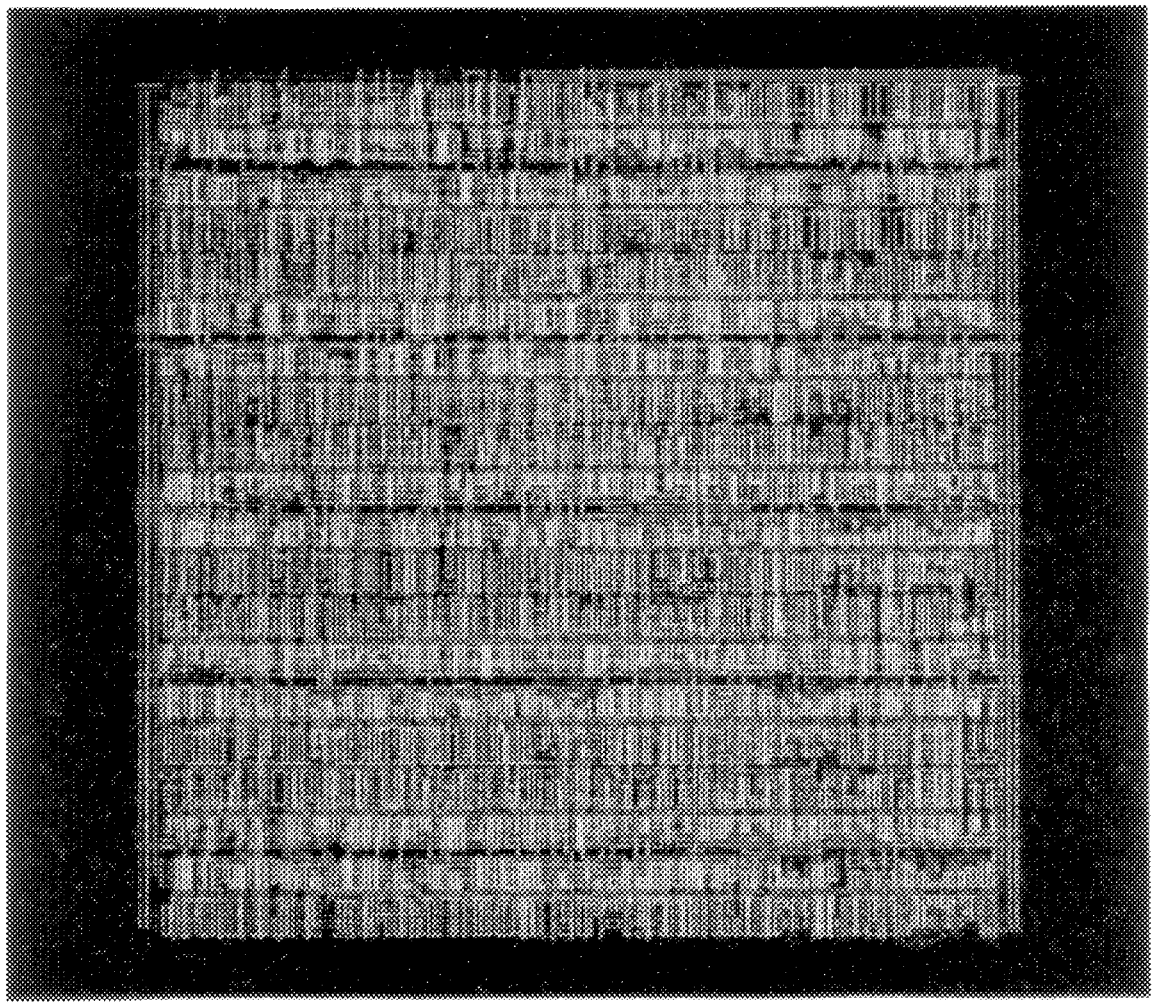
FIG. 18 shows a color screen from Chip Viewer of a place and route block of the present invention.

FIG. 18 shows a color screen from Chip Viewer of a place and route block of the present invention. FIG. 18 shows how Chip Viewer highlights a selected net (in magenta) that is routed through many blocks of an integrated circuit.

Figure 19:
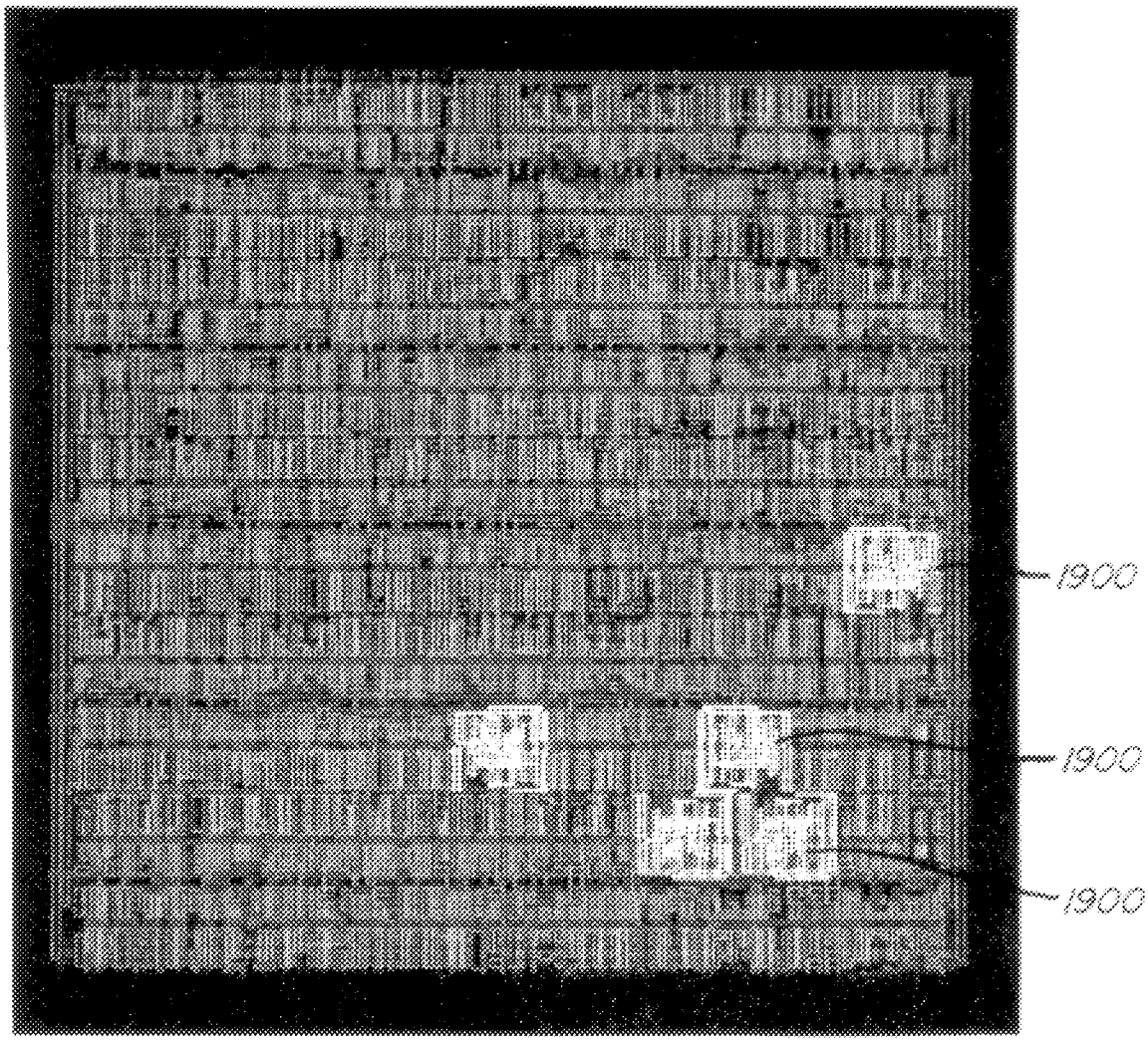
FIG. 19 shows a color screen from Chip Viewer of hierarchical block extraction of the present invention.

FIG. 19 shows a color screen from Chip Viewer of hierarchical block extraction of the present invention. FIG. 18 shows how Chip Viewer highlights a selected net 1900 (in white) that is routed through blocks of an integrated circuit. Further, net 1900 is contained on a hierarchical block. When a hierarchical block is selected (in white), all other similar blocks on the integrated circuit are selected (also in white).

Figure 20:
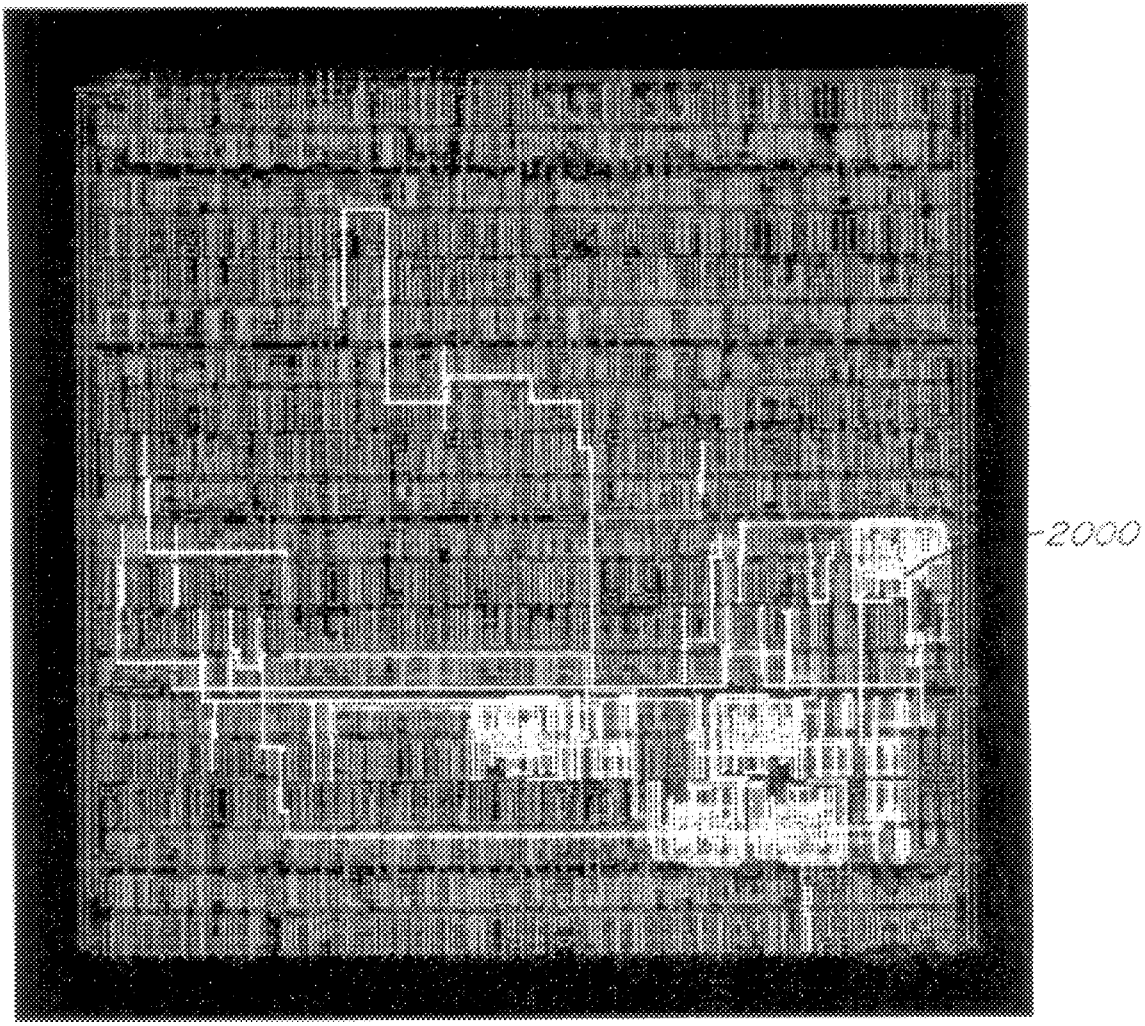
FIG. 20 shows a color screen from Chip Viewer of a hierarchical block and interconnect extraction.

FIG. 20 shows a color screen from Chip Viewer of a hierarchical block and interconnect extraction. FIG. 20 shows how Chip Viewer highlights a selected net 2000 (in white) that is routed through hierarchical blocks and other blocks of an integrated circuit. The present invention can extract layout parasitics for the selected net (in white).

Figure 21:
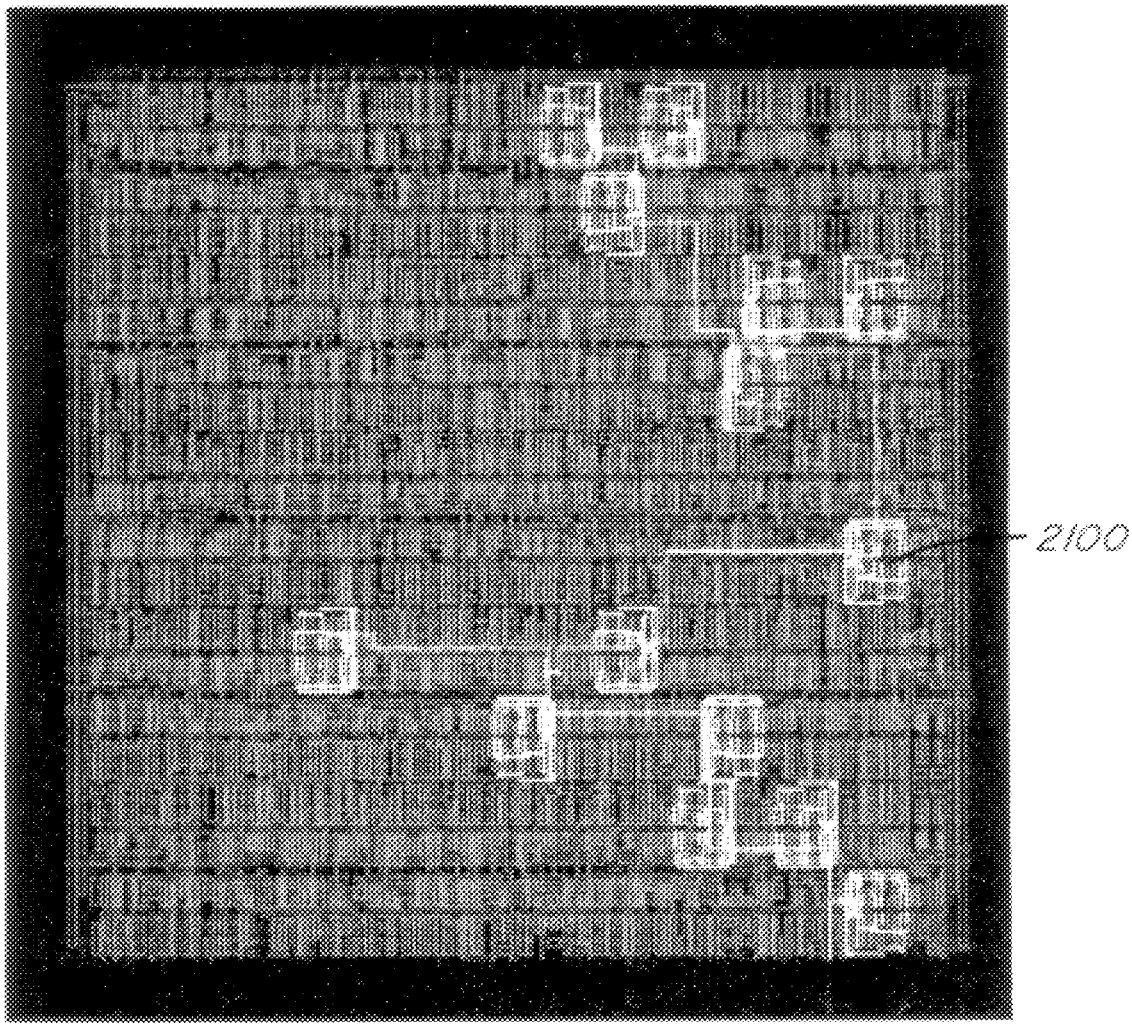
FIG. 21 shows a color screen from Chip Viewer of a clock tree extraction.

FIG. 21 shows a color screen from Chip Viewer of a clock tree extraction. FIG. 21 shows how Chip Viewer highlights a selected net 2100 (in white) that is routed through blocks of an integrated circuit. Net 2100 is a clock net. The present invention can perform a layout parasitics extraction on the clock tree of net 2100.

It will be understood that the foregoing is merely illustrative of the principles of this invention, and that various modifications can be made by those skilled in the art without departing from the scope and spirit of the invention.

What is claimed is:

1. A computer-implemented method for extracting parasitic capacitance data from a layout of an integrated circuit, the integrated circuit being described by a layout database, containing geometries of the integrated circuit, comprising the steps of:

reading a capacitance synthesis table having predefined parasitic capacitance values for predefined capacitance structures for geometries of the integrated circuit, wherein said predefined capacitance structures comprise interconnect capacitances and device capacitances;

comparing one of the geometries of the integrated circuit against said predefined capacitance structures in said capacitance synthesis table; and selecting one of said predefined parasitic capacitance values if one of the geometries of the integrated circuit matches one of said predefined capacitance structures.

2. A computer-implemented method for extracting parasitic capacitance data from a layout of an integrated circuit, the integrated circuit being described by a layout database, containing geometries of the integrated circuit, comprising the steps of:

reading a capacitance synthesis table having predefined parasitic capacitance values for predefined capacitance structures;

comparing one of the geometries of the integrated circuit against said predefined capacitance structures in said capacitance synthesis table;

selecting one of said predefined parasitic capacitance values if one of the geometries of the integrated circuit matches one of said predefined capacitance structures; and determining a parasitic capacitance value of one of the geometries of the integrated circuit by interpolating from said predefined capacitance values if one of the geometries of the integrated circuit substantially matches one of said predefined capacitance structures.

3. A computer-implemented method for extracting parasitic capacitance data from a layout of an integrated circuit, the integrated circuit being described by a layout database, containing geometries of the integrated circuit, comprising the steps of:

reading a capacitance synthesis table having predefined parasitic capacitance values for predefined capacitance structures;

comparing one of the geometries of the integrated circuit against said predefined capacitance structures in said capacitance synthesis table;

selecting one of said predefined parasitic capacitance values if one of the geometries of the integrated circuit matches one of said predefined capacitance structures;

comparing said one of the geometries of the integrated circuit against said predefined capacitance structures in a capacitance geometry structure library when said one of the geometries of the integrated circuit neither matches nor substantially matches one of said predefined capacitance structures;

determining a calculated parasitic capacitance value of one of the geometries of the integrated circuit by direct simulation if one of the geometries of the integrated circuit neither matches nor substantially matches one of said predefined capacitance structures; and adding said calculated parasitic capacitance value for said one of the geometries of the integrated circuit to said capacitance geometry structure library.

* * * * *